(12) United States Patent
Chiu et al.

(10) Patent No.: US 7,098,065 B2
(45) Date of Patent: Aug. 29, 2006

(54) INTEGRATED LID FORMED ON MEMS DEVICE

(75) Inventors: Anthony M. Chiu, Richardson, TX (US); Harry Michael Siegel, Hurst, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/952,183

(22) Filed: Sep. 28, 2004

(65) Prior Publication Data

US 2006/0065961 A1 Mar. 30, 2006

(51) Int. Cl.
*H01L 21/00* (2006.01)

(52) U.S. Cl. .................. 438/51; 73/514.31; 257/415

(58) Field of Classification Search ............... 438/51, 438/FOR. 432; 73/514.32; 257/415; 148/DIG. 159
See application file for complete search history.

(56) References Cited

U.S. PATENT DOCUMENTS

| | | | |
|---|---|---|---|
| 5,181,156 A * | 1/1993 | Gutteridge et al. ...... 361/283.1 |
| 5,417,235 A | 5/1995 | Wise et al. | |
| 5,441,597 A | 8/1995 | Bonne et al. | |
| 5,760,455 A * | 6/1998 | Hierold et al. ............... 257/415 |
| 5,834,332 A | 11/1998 | Hierold et al. | |
| 5,992,233 A | 11/1999 | Clark | |
| 6,892,577 B1 * | 5/2005 | Nagahara ................. 73/514.32 |
| 2003/0153116 A1 * | 8/2003 | Carley et al. ................. 438/53 |
| 2005/0124089 A1 * | 6/2005 | Gogoi et al. ................. 438/52 |

FOREIGN PATENT DOCUMENTS

| DE | 100 05 555 A1 | 8/2001 |
|---|---|---|
| WO | WO 95/09366 | 4/1995 |

OTHER PUBLICATIONS

Candler, Rob N., "Single Wafer Encapsulation on MEMS Devices," IEEE Transactions on Advanced Packaging, vol. 26, No. 3, Aug. 2003, pp. 227-232.
Candler, Rob, "Energy Loss Mechanisms in Micromechanical Resonators," http:/micromachine.stanford.edu/~rcandler/energyloss.html, 7 pages.
Guillou, David F., "Packaging MEMS: New Manufacturing Methodology Substantially Reduces Smart MEMS Costs," IC Mechanics, Inc., Sensors—Dec. 2003, 5 pages.

* cited by examiner

Primary Examiner—George Fourson
Assistant Examiner—John M. Parker
(74) Attorney, Agent, or Firm—Lisa K. Jorgenson; William A. Munck

(57) ABSTRACT

An integrated lid for microelectromechanical system (MEMS) devices is formed from a nitride layer deposited over a cavity containing movable parts for the device. Pillars are formed through openings within large area movable parts to support the lid over those parts. Slides are formed and moved under large etchant openings through the lid to allow the openings to be sealed by sputtering.

24 Claims, 16 Drawing Sheets

INTEGRATED LID FORMED ON MEMS DEVICE

TECHNICAL FIELD OF THE INVENTION

The present invention is directed, in general, to integrated circuit structures and, more specifically, to microelectromechanical system structures.

BACKGROUND OF THE INVENTION

Microelectromechanical system (MEMS) devices typically include at least one freely movable structure within a recess formed in a substrate and covered by a "lid" or overlying layer. Often the lid includes openings therethrough to allow etchant to be employed in removing a sacrificial material fixing the movable structure in place until the enclosure surrounding the structure is completely formed. Such openings, if not too large, may be subsequently sealed by sputtering metal into the opening. However, openings through the lid that are too small may not allow sufficient etchant to pass through to etch the structure as desired. Accordingly, the size of the openings and/or the time required to perform an etch through the openings is constrained.

In addition, if the area that must be covered by an unsupported portion of the lid is too large, the lid becomes fragile or prone to deformation, fracture or breakage. In a worst case, problems with the lid may potentially interfere with free movement of MEMS device structure. A large number of small openings through the lid merely increases the fragility of the lid.

There is, therefore, a need in the art for an improved lid for MEMS device structures.

SUMMARY OF THE INVENTION

To address the above-discussed deficiencies of the prior art, it is a primary object of the present invention to provide, for use in a microelectromechanical system (MEMS) device structure, an integrated lid formed from a nitride layer deposited over a cavity containing movable parts for the device. Pillars are formed through openings within large area movable parts to support the lid over those parts. Slides are formed and moved under large etchant openings through the lid to allow the openings to be sealed by sputtering.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 8C, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIGS. 1 through 8C are diagrams illustrating formation of a microelectromechanical system device structure having an integrated lid supported by pillars and having openings sealed by slides according to one embodiment of the present invention. Those skilled in the art will recognize that neither the complete structure of a MEMS device nor the complete process for formation of a MEMS device are depicted or described herein. Instead, for simplicity and clarity, only so much of the structure of a MEMS device and the process for formation of such a device as are unique to the present invention or necessary for an understanding of the present invention are depicted and described.

Figure 1:
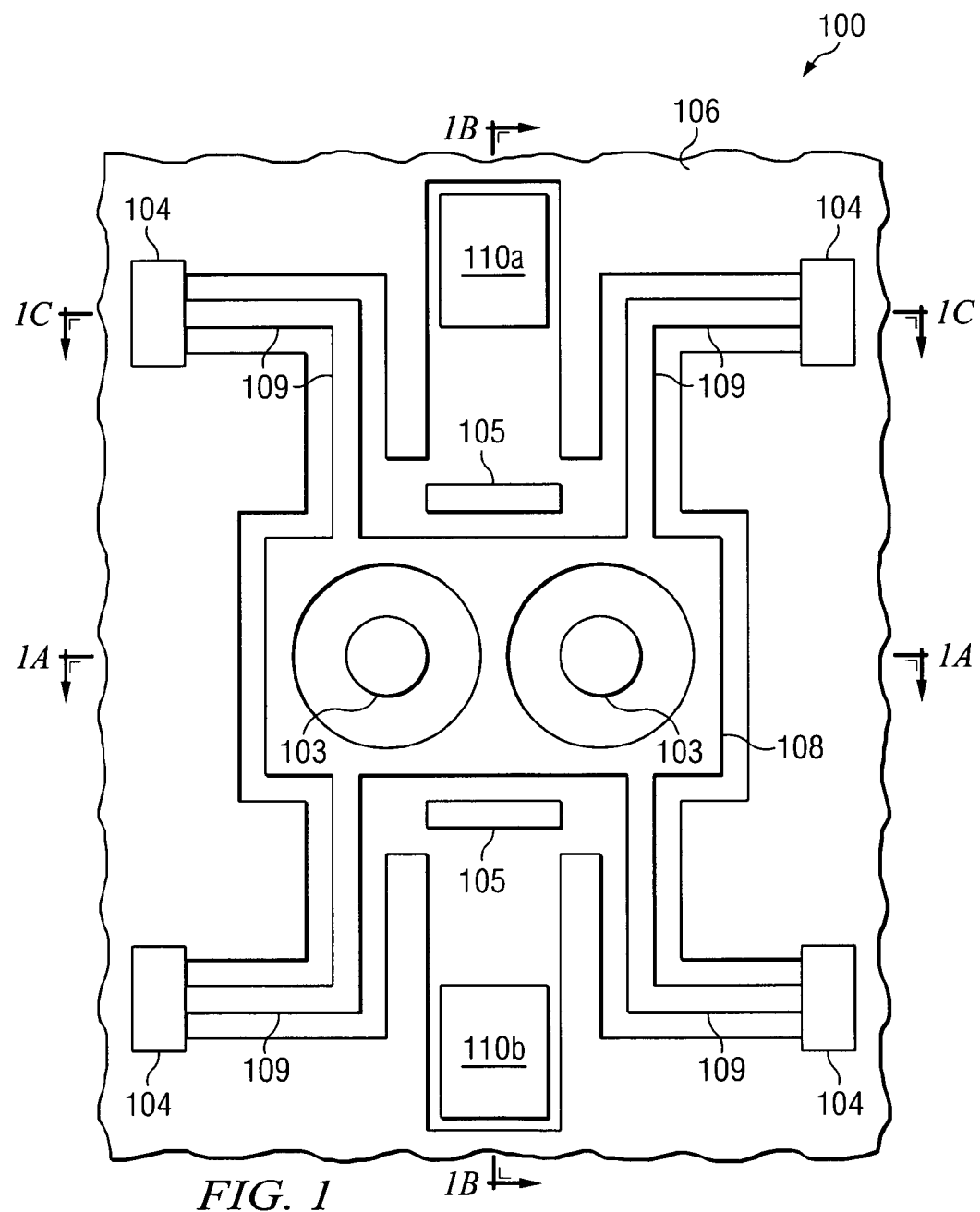
FIGS. 1 through 8C are diagrams illustrating formation of a microelectromechanical system device structure having an integrated lid supported by pillars and having openings sealed by slides according to one embodiment of the present invention.
Figure 1A:
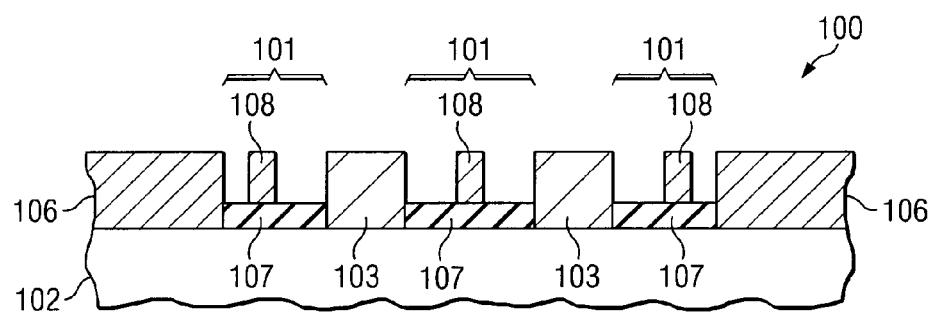
Figure 1B:
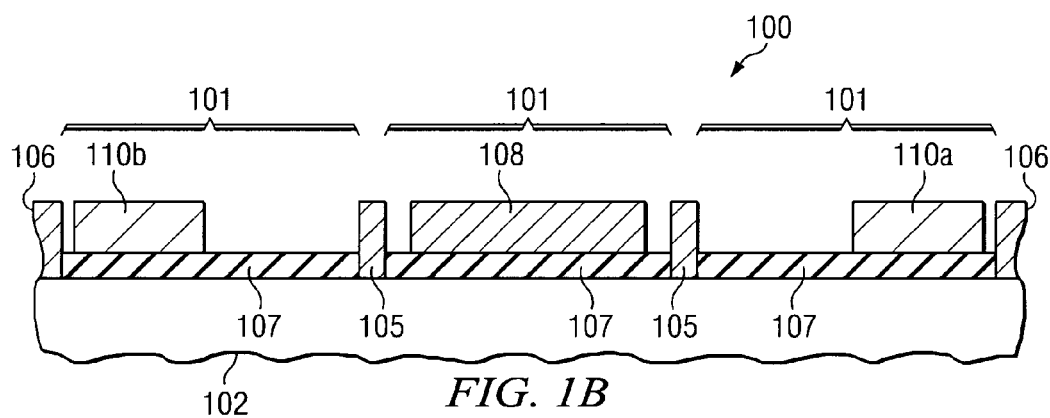
Figure 1C:
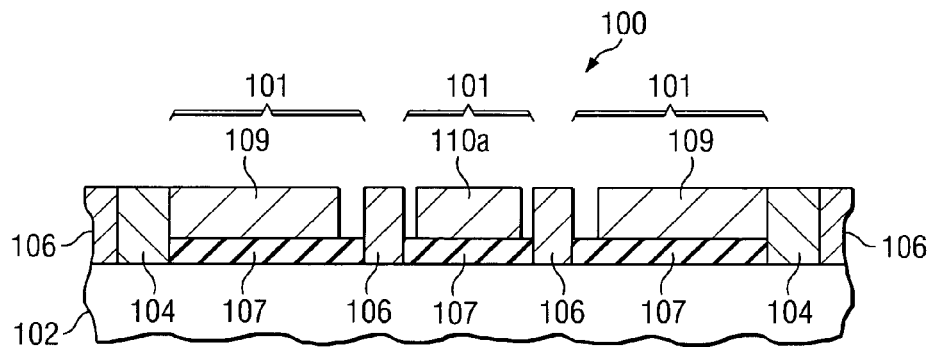

FIG. 1A is a plan view of a partially formed MEMS device structure. FIGS. 1A, 1B and 1C are cross-sectional views of the structure depicted in FIG. 1 taken at section lines A—A, B—B and C—C, respectively. The same views of the device structure at different stages of processing are depicted in FIGS. 2 and 2A–2C, 3 and 3A–3C, etc.

MEMS device structure 100 is formed by patterning recesses 101 in a silicon substrate 102, within which moveable structures will be formed, and leaving elevated regions 103–106. In the example depicted, a sacrificial oxide material 107 is formed at the bottom of the recesses 101, and polysilicon is deposited thereon and selectively patterned to form movable parts 108, 109 and 110a–110b. In an alternative embodiment, the structure for the movable parts 108, 109 and 110a–110b is simply patterned from the silicon substrate 102 at the same time that recesses 101 are formed, and extend all the way to the bottom of the recesses 101 in the same manner the elevated regions 103–106.

The MEMS device structure 100 depicted in the exemplary embodiment is a portion of an accelerometer. The accelerometer includes an inertia element or body 108, tethers 109 and anchors 104, where the body 108 and tethers 109 are, at the completion of formation of the MEMS device, freely movable. In operation, tethers 109 flex to allow movement of body 108 in response to acceleration of the MEMS device structure. Body 108 forms a capacitor with one or more other structures, with a capacitance that varies with movement of body 108 in response to acceleration of the integrated circuit containing the MEMS device structure 100. For example, while anchors 104 are electrically connected to body 108, electrodes 105 are electrically isolated from body 108. Accordingly, one of body 108 and electrodes 105 may be connected to power and the other connected to ground to work as a variable capacitor.

The accelerometer body 108 should preferably have a large area and significant mass, but need not necessarily be solid. Accordingly, in the present invention, pillars 103 are formed within openings through the body 108. These pillars 103 will provide support for the integrated lids as described in further detail below. In addition, movable parts 110a and 110b will form slides in the final MEMS device structure that may be moved by applying a voltage to electrodes 105 to seal large openings, also as described in further detail below.

Figure 2:
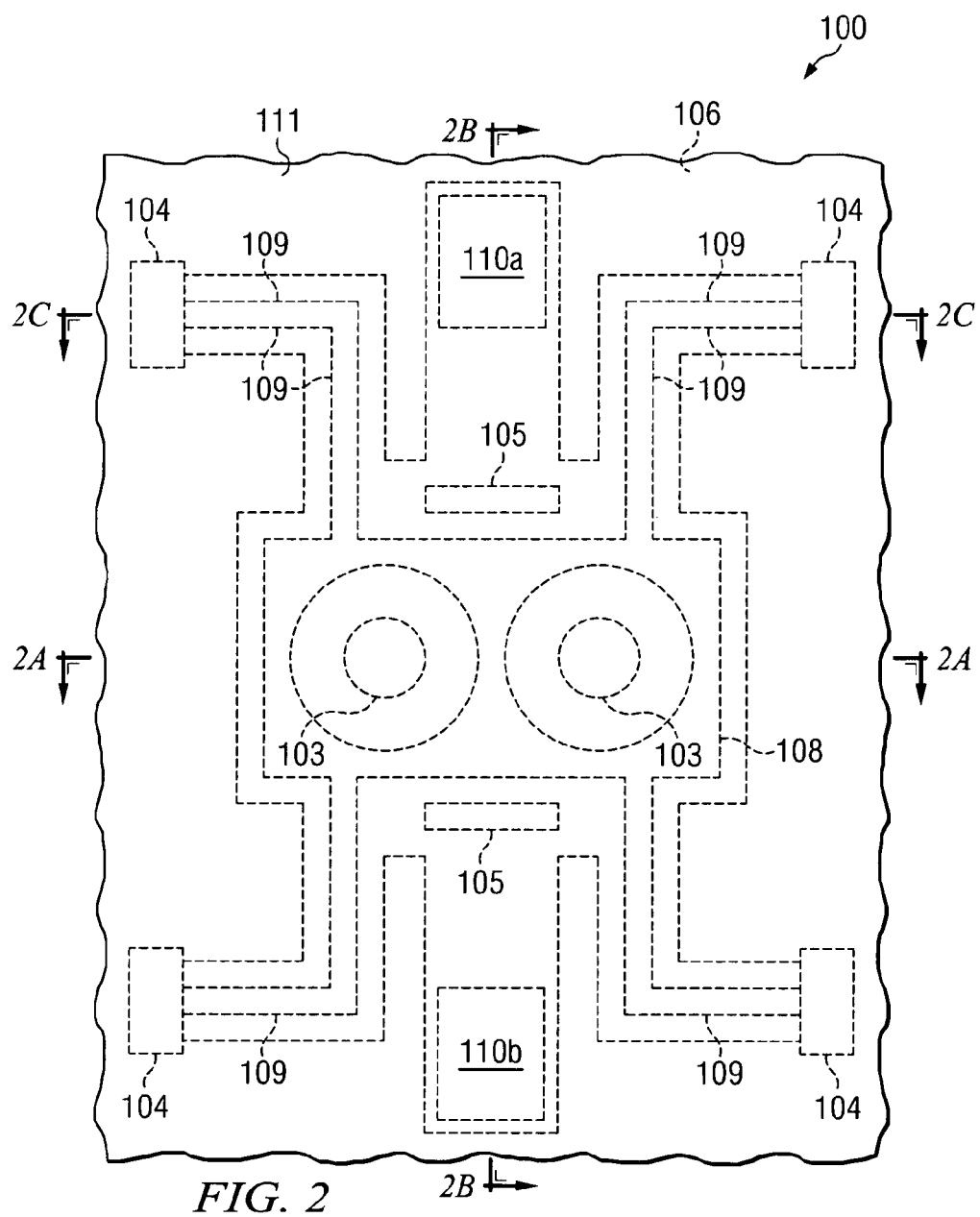
Figure 2A:
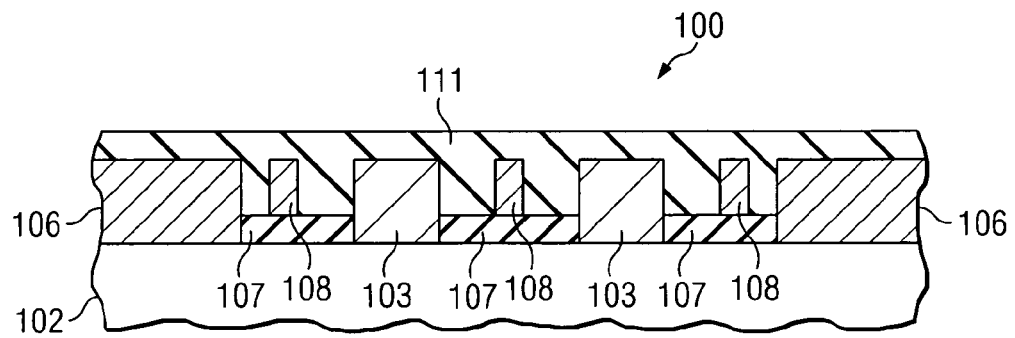
Figure 2B:
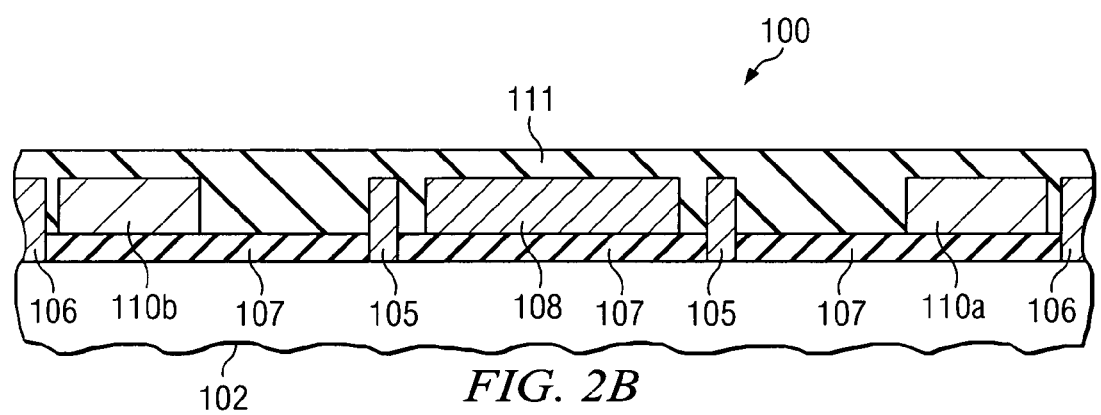
Figure 2C:
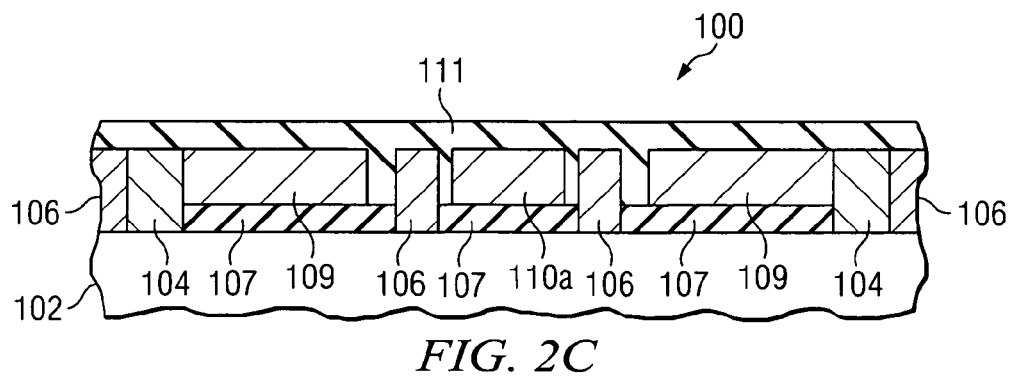
Figure 3:
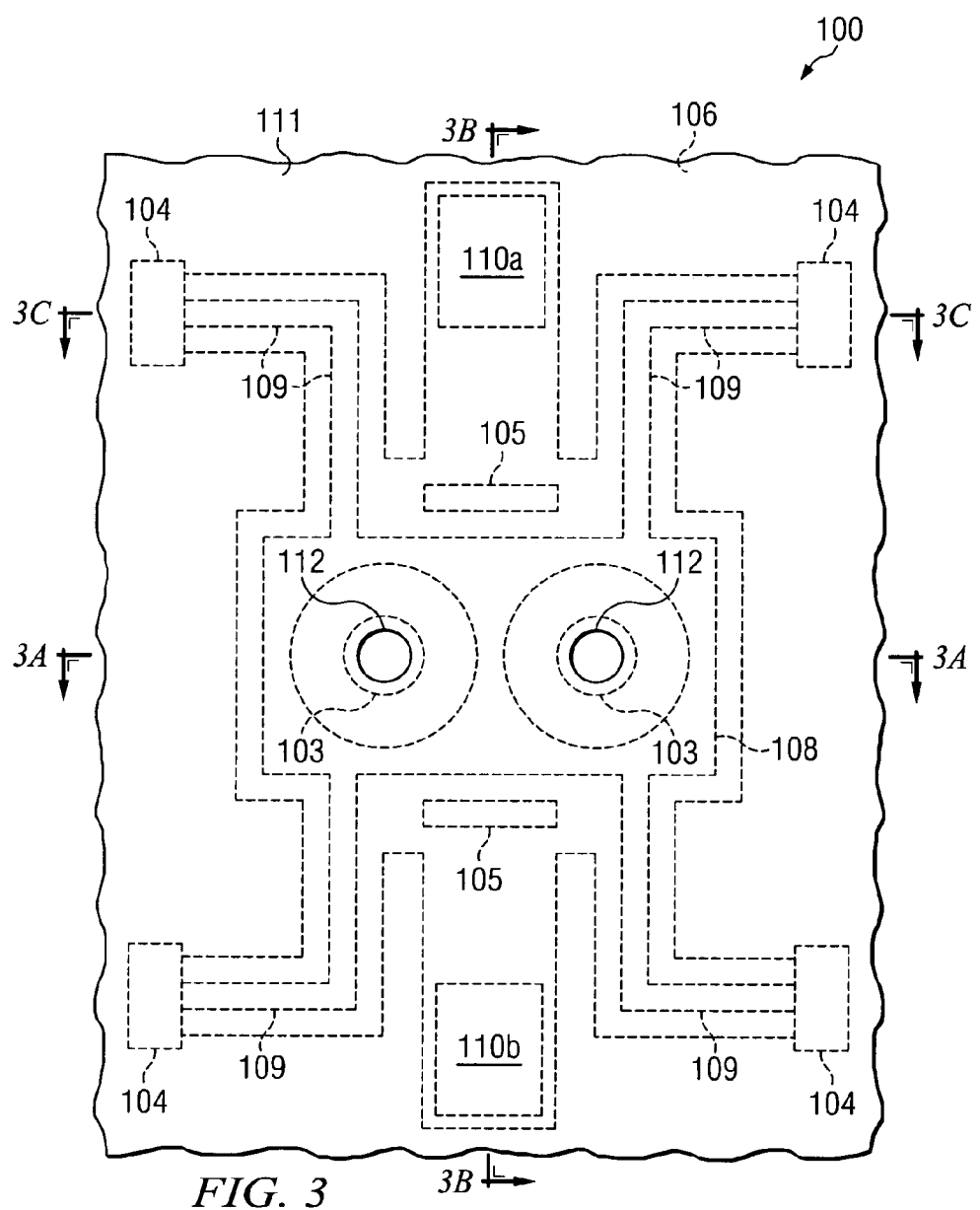
Figure 3A:
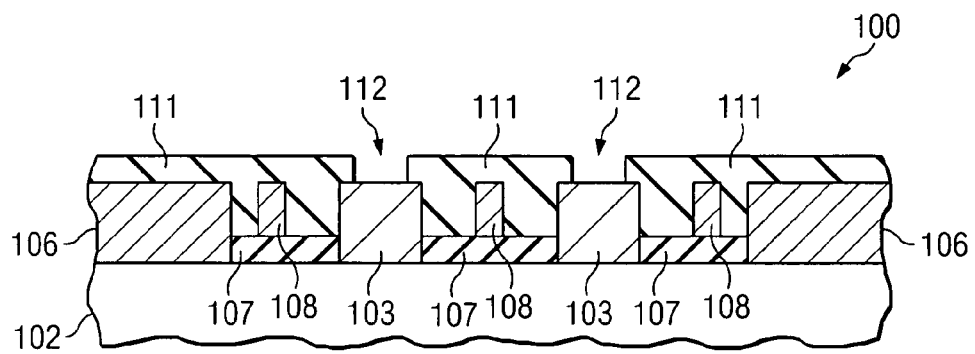
Figure 3B:
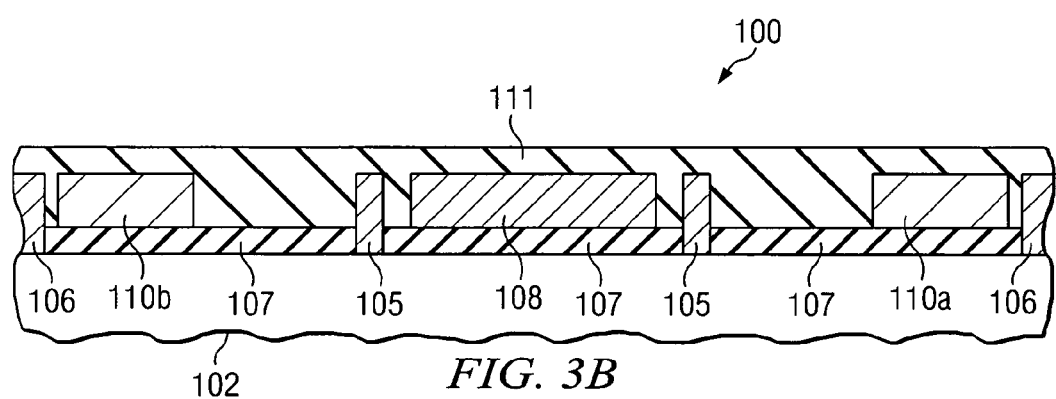
Figure 3C:
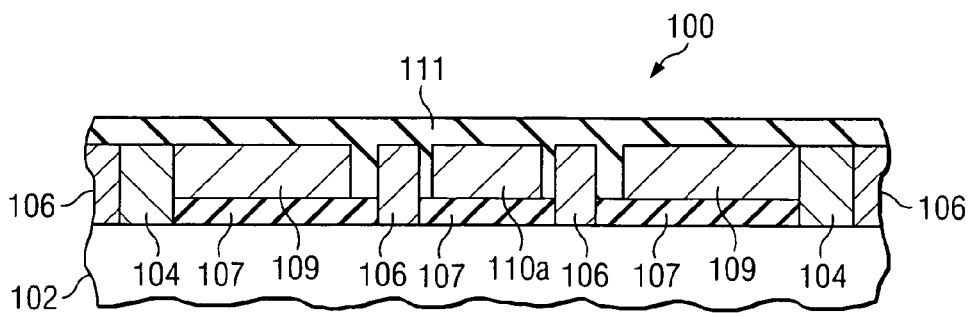
Figure 4:
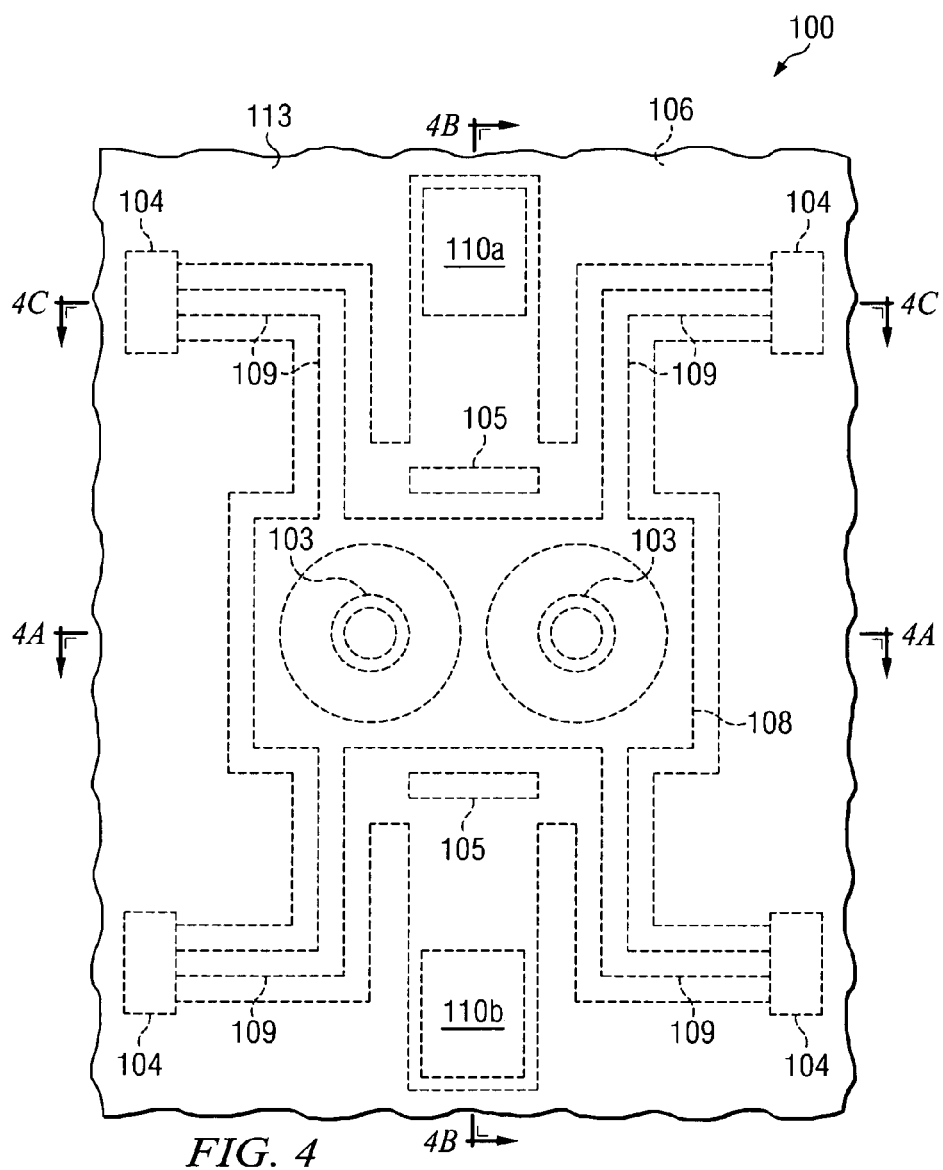
Figure 4A:
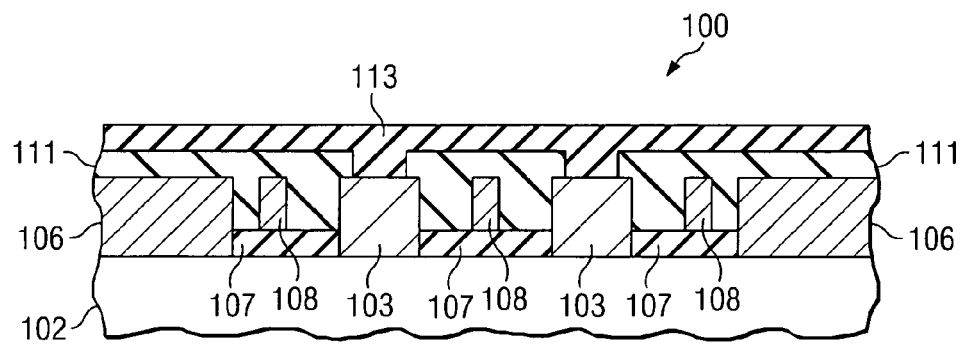
Figure 4B:
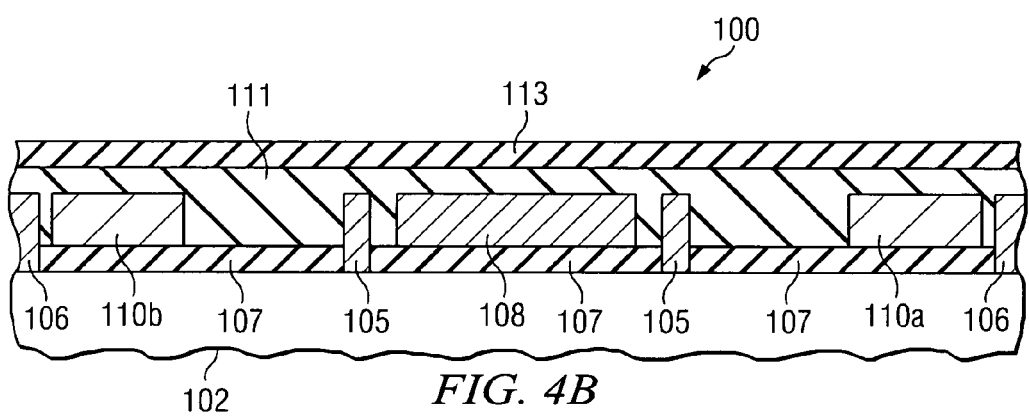
Figure 4C:
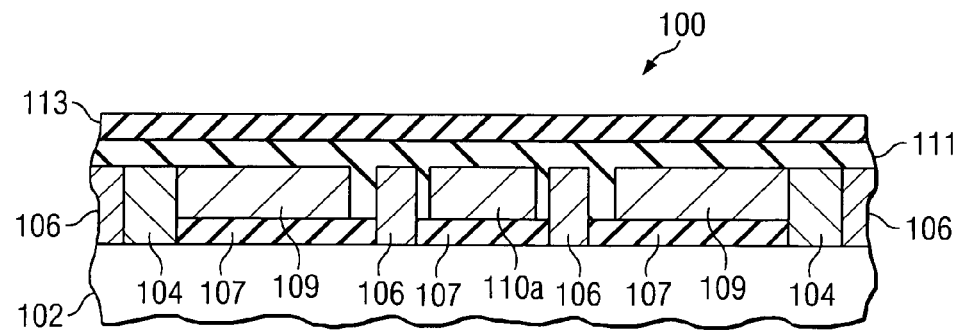
Figure 5:
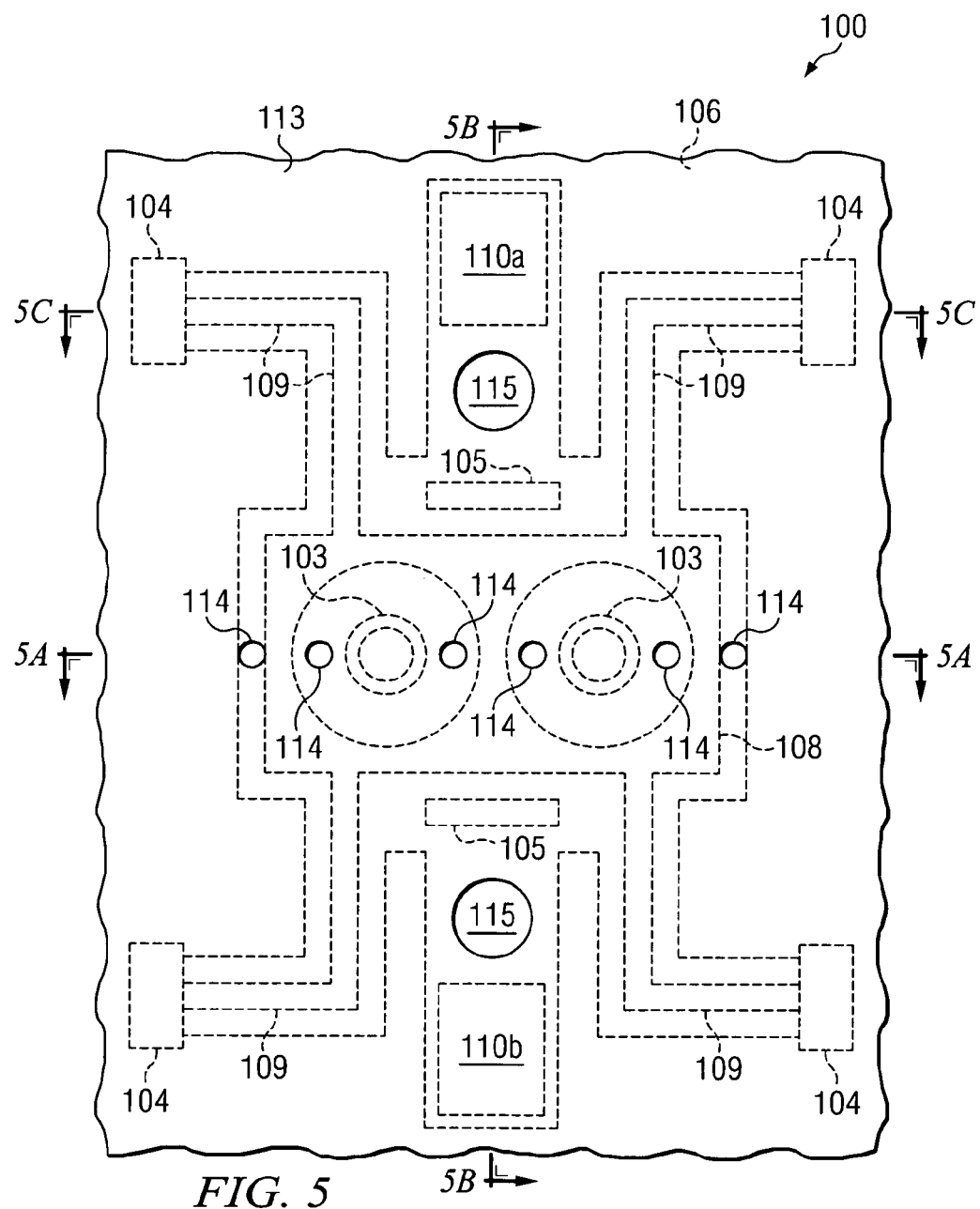
Figure 5A:
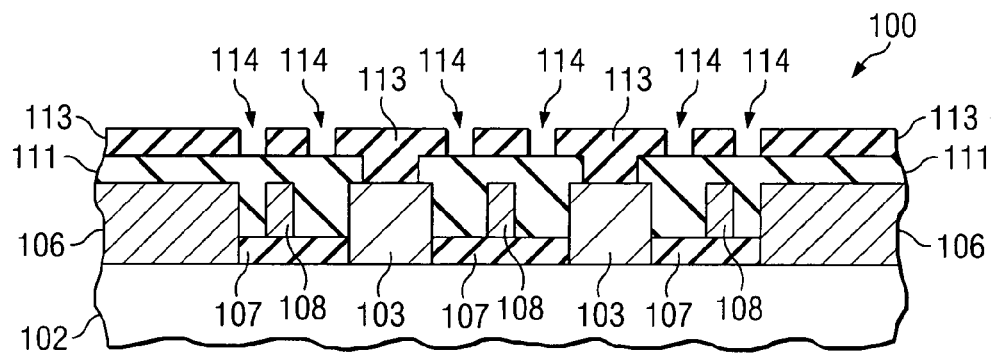
Figure 5B:
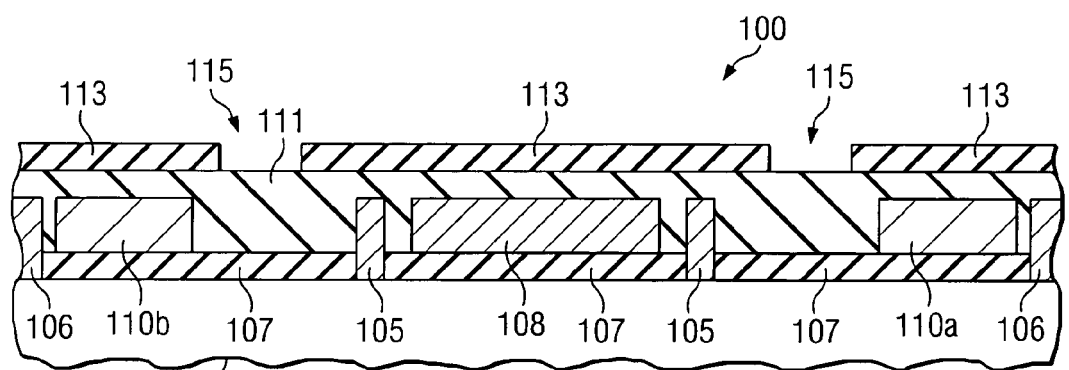
Figure 5C:
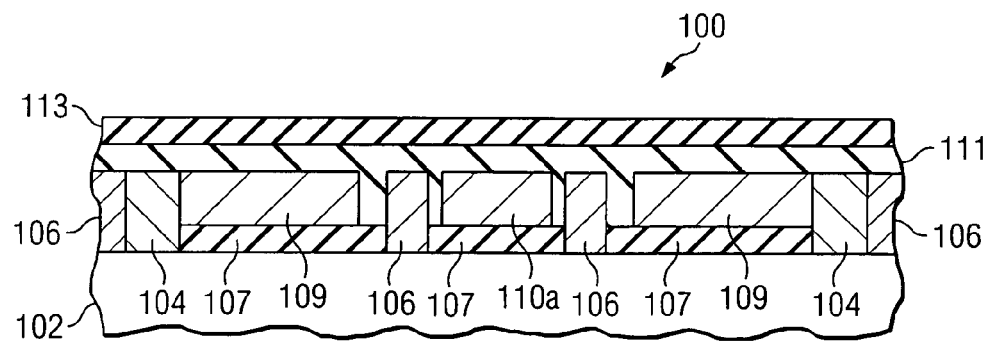
Figure 6:
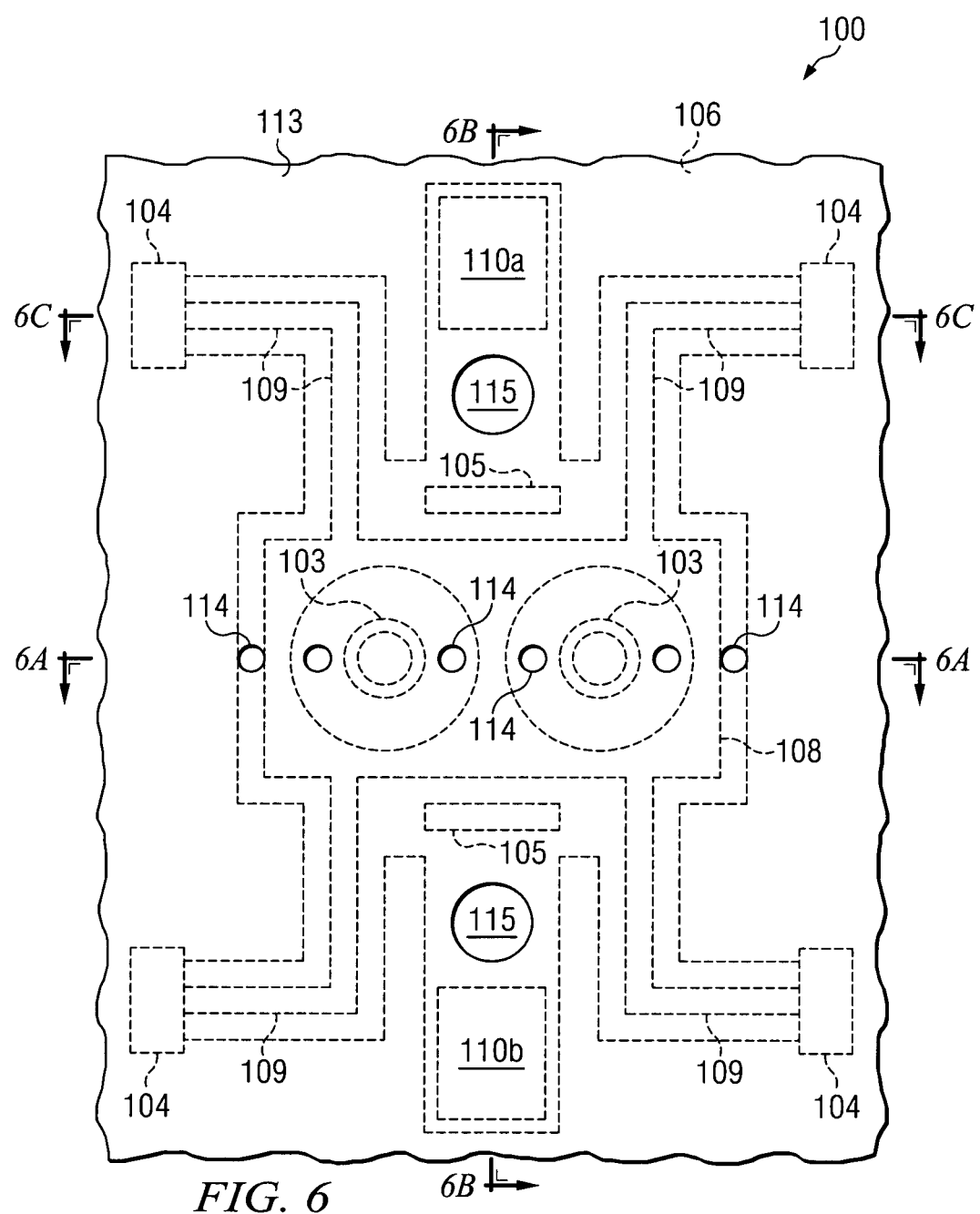
Figure 6A:
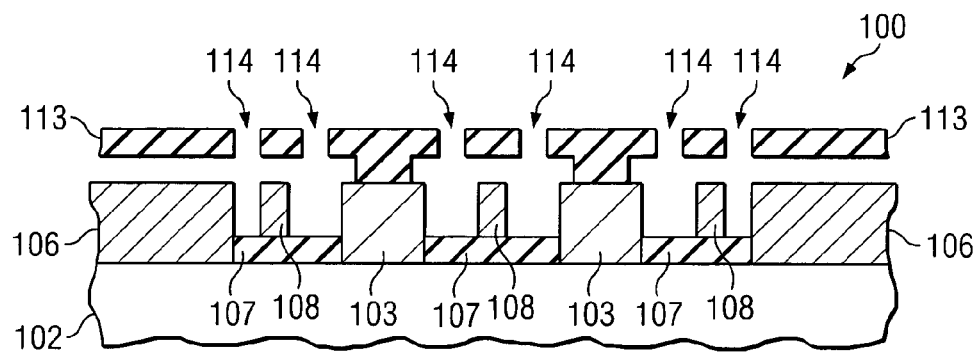
Figure 6B:
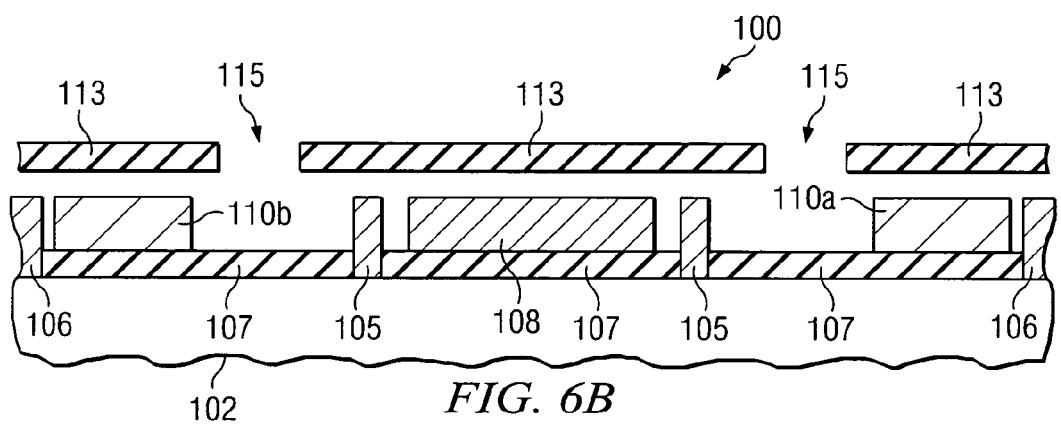
Figure 6C:
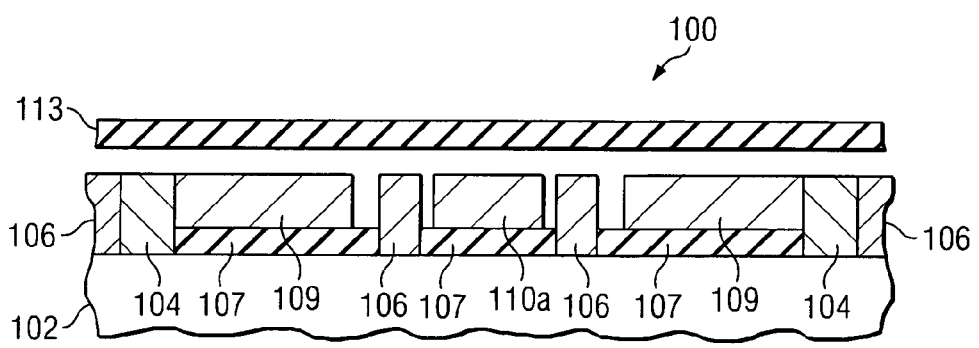
Figure 7:
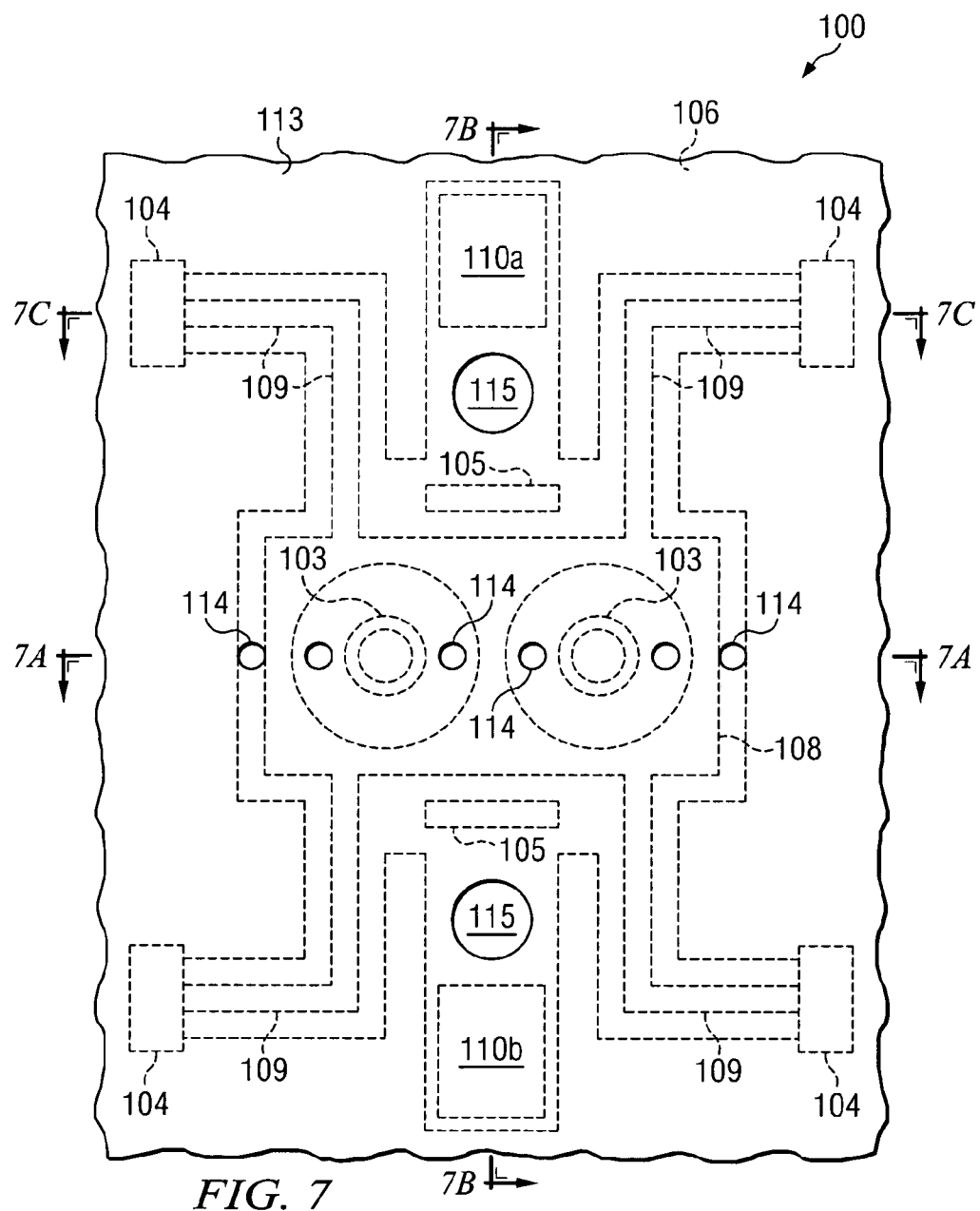
Figure 7A:
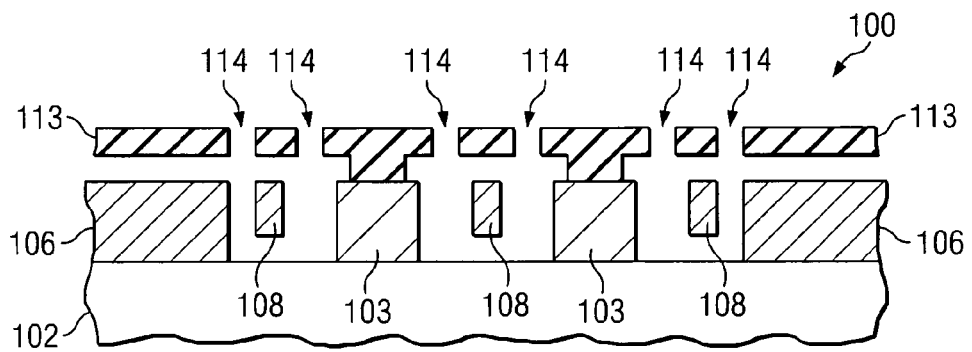
Figure 7B:
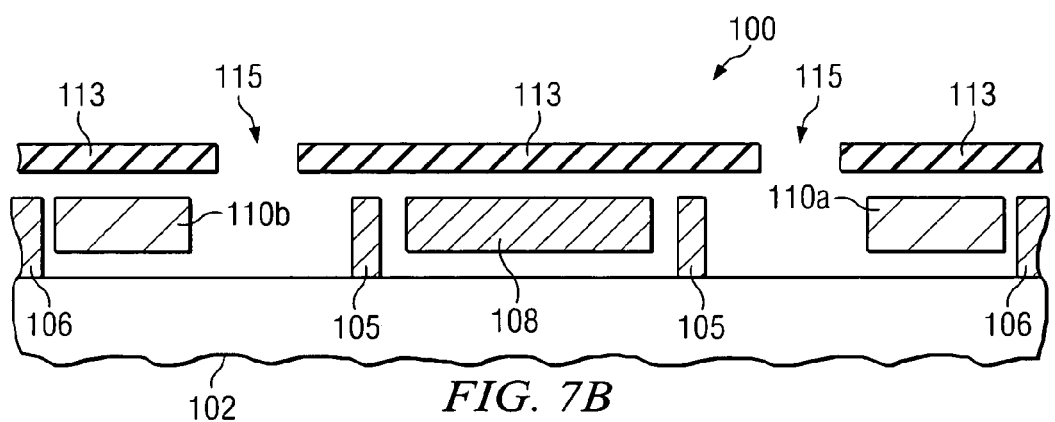
Figure 7C:
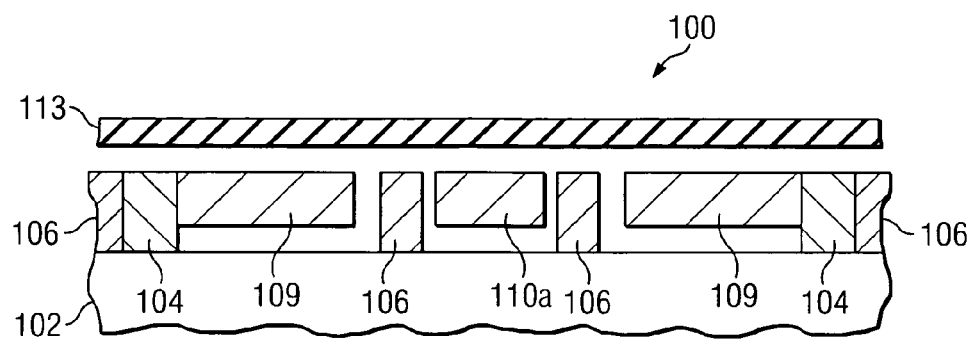
Figure 8:
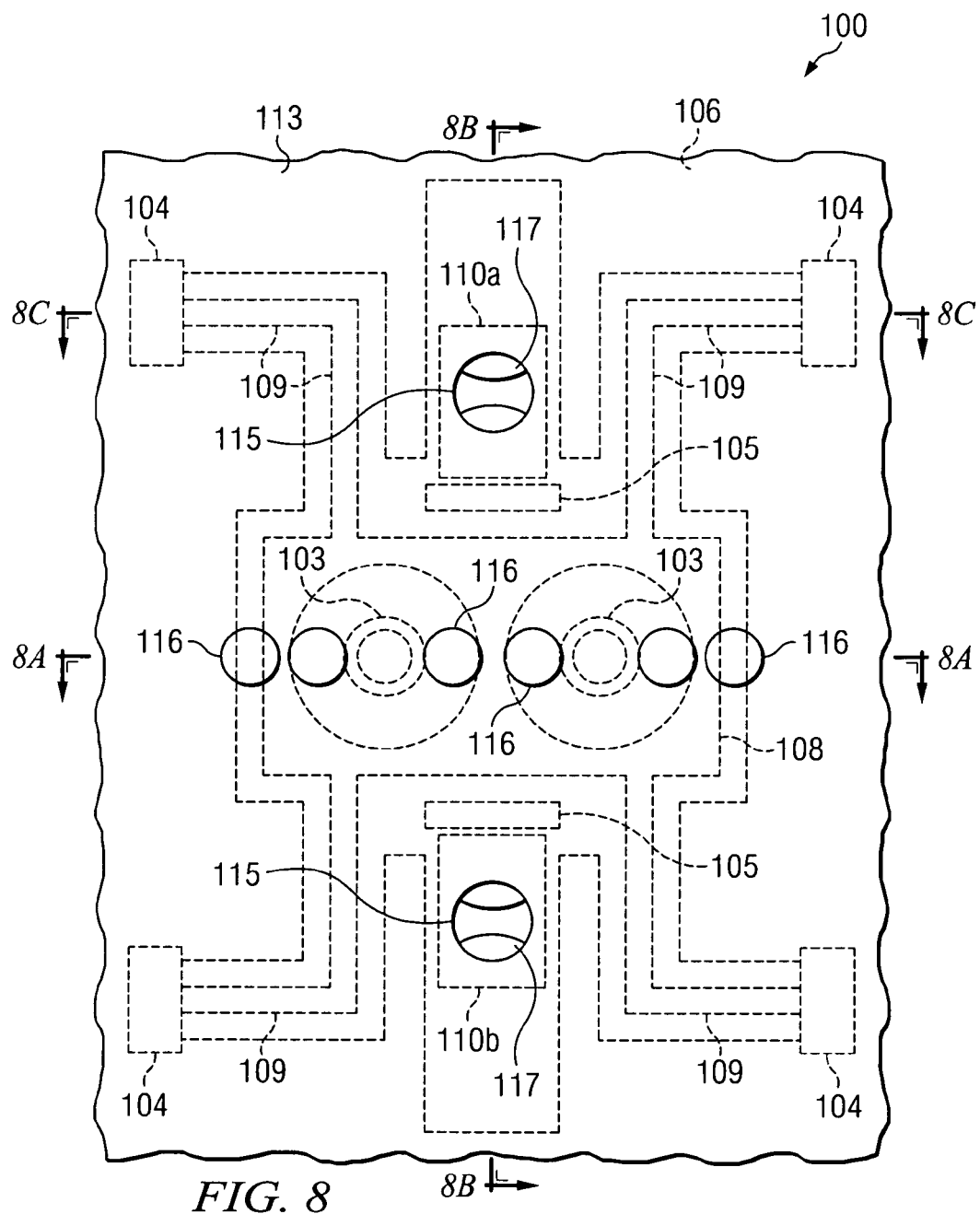
Figure 8A:
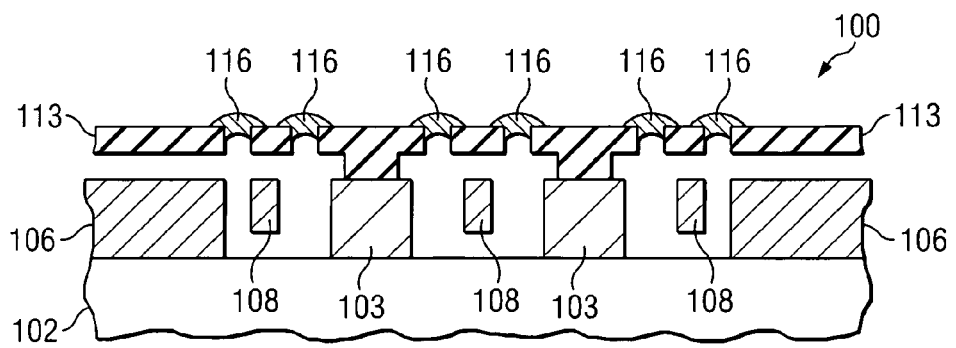
Figure 8B:
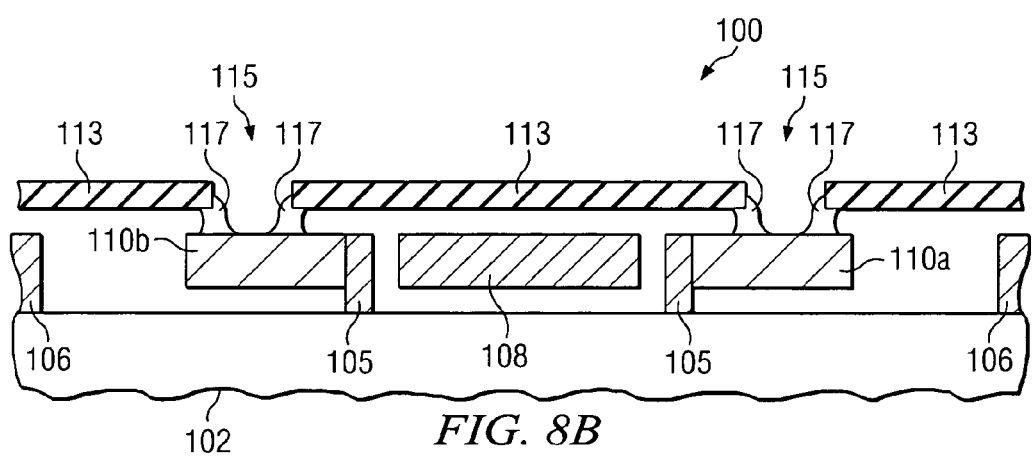
Figure 8C:
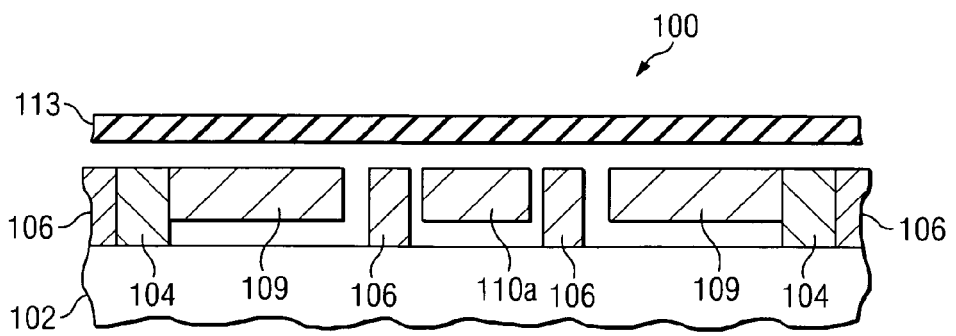

The grooves between elevated regions 103–106 and movable parts 108, 109 and 110a–110b is backfilled with additional sacrificial oxide 111 as illustrated in the cross-sectional views of FIGS. 2A–2C, with the MEMS device structure 100, covered by the oxide 111, being shown in phantom in the plan view FIG. 2. The oxide 111 may be conformally deposited, but is then preferably planarized by chemical-mechanical polishing (CMP) or another planarization process. In the example shown, some thickness of oxide 111 remains overlying the tops of elevated regions 103–106 and movable parts 108, 109 and 110a–110b after planarization.

In the exemplary embodiment, openings 112 are etched through the remaining thickness of oxide 111 over pillars 103 as shown in FIGS. 3 and 3A–3C.

A nitride passivation layer 113 is then formed over the entire structure as depicted in FIGS. 4 and 4A–4C, in contact with the exposed upper surfaces of pillars 103. Nitride 113 will form the integrated lid over the MEMS device structure, supported by pillars 103 in the area over the accelerometer body in the exemplary embodiment.

As illustrated in FIGS. 5 and 5A–5C, small openings 114 through nitride 113 are then formed over the grooves defining the MEMS device structure, while large openings 115, about 3 microns (μm) in diameter, are formed through the nitride 113 in the regions adjacent to slides 110a–110b. Etchant is then introduced through the openings 114–115, removing the sacrificial oxide 111 as illustrated in FIGS. 6 and 6A–6C.

If a sacrificial oxide 107 was formed under the movable parts, the etchant is also employed to remove that oxide. If no sacrificial oxide 107 was employed, and the movable parts were instead patterned directly from the silicon substrate, a directionally preferential etchant is introduced through openings 114–115 to remove about a 0.5 μm thickness of silicon at the bottom of the cavities. In either event, this etch should completely undercut the movable parts (body 108, tethers 109 and slides 110a–110b) without completely undercutting the (wider) pillars 103, anchors 104, electrodes 105, and elevated regions 106 as illustrated in FIGS. 7 and 7A–7C. In one embodiment, the pillars 103 may be formed of the sacrificial oxide material rather than from the substrate, with a width sufficient to prevent the pillars from being completely undercut when the etch is performed to undercut the (narrower) movable parts.

If no sacrificial oxide is used beneath the movable parts, pillars 103, anchors 104, electrodes 105, and elevated regions 106 should all be wider than the widest portions of body 108, tethers 109 and slides 110a–110b, so that those "fixed" structures are not completely undercut by the directionally preferential etch. The thickness of the undercut movable parts is preferably about 3–4 μm, but may be up to 10–20 μm.

After the etching is completed and the etchant is removed, a voltage is applied to electrodes 105, which may necessitate a hole, not shown, opened through nitride lid 111, or alternatively may be accomplished using conductive structures, also not shown, within the substrate and connected to the bottom of electrodes 105. The voltage causes slides 110a–110b to move beneath the large openings as illustrated in FIGS. 8 and 8A–8C. Metal or other deposited material is then sputtered to form plugs 116 within the small openings and seals 117 between the slides 110a–110b and nitride lid 111.

In the exemplary embodiment, slides 110a–110b are shown as completely disconnected from a remainder of the MEMS device structure 100. In an alternative embodiment, however, the slides may in fact be connected by a relatively thin strip of material to a portion of the "frame" (i.e., the elevated regions 106 surrounding the accelerometer) similar to tethers 109, and move beneath the large openings by rotation rather than by translation. In either cases, latches (not shown) may be formed to retain the slides in place after the slides are moved beneath the opening. A ratchet-type pawl-and-catch latch, a pair of detents catching protrusions on biased arms extending from either side of the slide, or any other suitable mechanical latching mechanism may be employed for that purpose.

The present invention allows MEMS devices having elements with a large but not necessarily continuous area to be formed beneath an integrated lid by providing pillars to support the lid, increasing mechanical strength of the lid against breakage. The MEMS device structure is sealed during wafer fabrication without bonding another silicon substrate or ceramic lid over the cavities in which the movable parts are formed. The device may be further sealed with a liquid encapsulant prior to singulation.

The present invention also allows large openings to be formed through the integrated lid to facilitate introduction of the etchant(s) required to separate movable structures from adjacent and/or underlying regions, with slides provided to allow the lid to be sealed against particles and liquids once the MEMS device formation is complete. Larger MEMS devices are possible, since the etchant openings limit the size of structures that may be undercut. Any additional masks required to form the slide and/or additional steps required to, for instance, apply the liquid encapsulant are offset by the processing savings from not using another substrate or a ceramic lid to sealing the MEMS device.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. An integrated circuit structure comprising:
    a cavity within a substrate;
    an integrated lid over the cavity having an opening therethrough;
    a first movable element disposed within the cavity, the first movable element having an opening therethrough and adapted for physical movement in at least one direction within the cavity; and
    a pillar extending from a bottom of the cavity through the opening in the first movable element to an inner surface of the integrated lid;
    wherein the opening through the lid is sealed using a second movable element within the cavity.

2. The integrated circuit structure according to claim 1, wherein:
    the second movable element is disposed beneath the opening through the lid; and
    the opening through the lid is sealed using a material formed between the second movable element and the lid.

3. The integrated circuit structure according to claim 2, wherein, prior to formation of the material between the second movable element and the lid, the second movable element is selectively movable between:
    a first position within the cavity wherein the second movable element is not disposed beneath the opening through the lid; and
    a second position within the cavity wherein the second movable element is disposed beneath the opening through the lid.

4. The integrated circuit structure according to claim 1, wherein the second movable element is tethered to a sidewall of the cavity.

5. The integrated circuit structure according to claim 1, wherein the second movable element is secured in position beneath the opening through the lid by at least one latch.

6. The integrated circuit structure according to claim 1, wherein the pillar has a width greater than a widest portion of the first movable element in a cross-section of the integrated circuit structure.

7. The integrated circuit structure according to claim 1, further comprising:
    a sacrificial material within the cavity between the first movable element and sidewalls of the cavity, wherein the first movement element is capable of physical movement in the at least one direction within the cavity upon removal of the sacrificial material and any other sacrificial material within the cavity adjacent to the first movable element.

8. The integrated circuit structure according to claim 1, further comprising:
    a sacrificial material within the cavity between the first movable element and the bottom of the cavity, wherein the first movement element is capable of physical movement in the at least one direction within the cavity upon removal of the sacrificial material and any other sacrificial material within the cavity adjacent to the first movable element.

9. The integrated circuit structure according to claim 1, further comprising:
    a sacrificial material within the cavity between the first movable element and the lid, wherein the first movement element is capable of physical movement in the at least one direction within the cavity upon removal of the sacrificial material and any other sacrificial material within the cavity adjacent to the first movable element.

10. An integrated circuit structure comprising:
    a cavity within a substrate;
    an integrated lid over the cavity, the lid having an opening therethrough;
    a slide within the cavity disposed beneath the opening through the lid; and
    a material formed between the slide and the lid,
    wherein the opening through the lid is sealed by the slide and the material formed between the slide and the lid.

11. The integrated circuit structure according to claim 10, further comprising:
    a moving part disposed within the cavity, the moving part having an opening therethrough and adapted to be selectively capable of physical movement in at least one direction within the cavity; and
    a pillar extending from a bottom of the cavity through the opening in the moving part to an inner surface of the integrated lid.

12. The integrated circuit structure according to claim 11, wherein the pillar has a width greater than a widest portion of the moving part in a cross-section of the integrated circuit structure.

13. The integrated circuit structure according to claim 10, wherein, prior to formation of the material between the slide and the lid, the slide is selectively movable between:
    a first position within the cavity wherein the slide is not disposed beneath the opening through the lid; and
    a second position within the cavity wherein the slide is disposed beneath the opening through the lid.

14. The integrated circuit structure according to claim 10, wherein the slide is tethered to a sidewall of the cavity.

15. The integrated circuit structure according to claim 10, wherein the slide is secured in position beneath the opening through the lid by at least one latch.

16. The integrated circuit structure according to claim 11, further comprising:
    a sacrificial material within the cavity between the moving part and sidewalls of the cavity, wherein the moving part is capable of physical movement in the at least one direction within the cavity upon removal of the sacrificial material and any other sacrificial material within the cavity adjacent to the moving part.

17. The integrated circuit structure according to claim 11, further comprising:
    a sacrificial material within the cavity between the moving part and the bottom of the cavity, wherein the moving part is capable of physical movement in the at least one direction within the cavity upon removal of the sacrificial material and any other sacrificial material within the cavity adjacent to the moving part.

18. The integrated circuit structure according to claim 11, further comprising:
    a sacrificial material within the cavity between the moving part and the lid, wherein the moving part is capable of physical movement in the at least one direction within the cavity upon removal of the sacrificial material and any other sacrificial material within the cavity adjacent to moving part.

19. A method of forming an integrated circuit structure, the method comprising:
    forming a cavity within a substrate;
    forming a moving part within the cavity, the moving part having an opening therethrough and adapted for physical movement in at least one direction within the cavity;
    forming an integrated lid over the cavity; and forming a pillar extending from a bottom of the cavity through the opening in the moving part to an inner surface of the integrated lid;

wherein the pillar has a width greater than a widest portion of the moving part in a cross-section of the integrated circuit structure.

20. The method according to claim 19, further comprising:

forming a sacrificial material within the cavity between the moving part and at least one of: sidewalls of the cavity, the bottom of the cavity, and the lid, wherein the moving part is capable of physical movement in the at least one direction within the cavity upon removal of all sacrificial material within the cavity adjacent to the moving part.

21. A method of forming an integrated circuit structure, the method comprising:

forming a cavity within a substrate;

forming an integrated lid over the cavity, the lid having an opening therethrough;

forming a slide within the cavity disposed beneath the opening through the lid; and forming a material between the slide and the lid, wherein the opening through the lid is sealed by the slide and the material formed between the slide and the lid.

22. The method according to claim 21, wherein, prior to formation of the material between the slide and the lid, the slide is selectively movable between:

a first position within the cavity wherein the slide is not disposed beneath the opening through the lid; and a second position within the cavity wherein the slide is disposed beneath the opening through the lid.

23. The method according to claim 21, wherein the slide is tethered to a sidewall of the cavity.

24. The method according to claim 21, wherein the slide is secured in position beneath the opening through the lid by at least one latch.

* * * * *